United States Patent
Cho et al.

(10) Patent No.: US 10,056,512 B2
(45) Date of Patent: Aug. 21, 2018

(54) METHOD OF FORMING CHALCOGEN COMPOUND LIGHT-ABSORPTION LAYER THIN FILM FOR SOLAR CELL

(71) Applicant: KOREA INSTITUTE OF ENERGY RESEARCH, Daejeon (KR)

(72) Inventors: Ara Cho, Daejeon (KR); Jun-Sik Cho, Daejeon (KR); Jae-Ho Yun, Daejeon (KR); Sejin Ahn, Daejeon (KR); Jihye Gwak, Daejeon (KR); Jin-su Yoo, Daejeon (KR); Seoung-Kyu Ahn, Daejeon (KR); Joo-Hyung Park, Daejeon (KR); Young-Joo Eo, Daejeon (KR); Ki-hwan Kim, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 32 days.

(21) Appl. No.: 15/209,837

(22) Filed: Jul. 14, 2016

(65) Prior Publication Data

US 2017/0141250 A1    May 18, 2017

(30) Foreign Application Priority Data

Nov. 12, 2015    (KR) .................. 10-2015-0159160

(51) Int. Cl.
*B05D 5/12*    (2006.01)
*H01L 31/032*    (2006.01)
*H01L 31/18*    (2006.01)

(52) U.S. Cl.
CPC .......... *H01L 31/0324* (2013.01); *H01L 31/18* (2013.01); *H01L 31/1864* (2013.01)

(58) Field of Classification Search
CPC .................................................. H01L 31/0324
See application file for complete search history.

(56) References Cited

U.S. PATENT DOCUMENTS

| 4,681,777 | A  | * | 7/1987 | Engelken ............ C23C 16/4485 |
| | | | | 423/565 |
| 2011/0147940 | A1 | * | 6/2011 | Akolkar ................ H01L 21/288 |
| | | | | 257/762 |
| 2012/0027937 | A1 | | 2/2012 | Gordon et al. |
| 2014/0318623 | A1 | | 10/2014 | Lany |

FOREIGN PATENT DOCUMENTS

| KR | 10-1540032 B1 | 9/2013 |
| KR | 10-1331971 B1 | 11/2013 |
| KR | 10-1386901 B1 | 4/2014 |
| KR | 10-1512749 B1 | 4/2015 |
| KR | 10-2015-0051148 A | 5/2015 |
| KR | 10-2015-0051151 A | 5/2015 |

OTHER PUBLICATIONS

Vera Steinmann, et al., "3.88% Efficient Tin Sulfide Cells using Congruent Thermal Evaporation", Advance Materials, Material Views, 2014, pp. 1-5.

* cited by examiner

*Primary Examiner* — Austin Murata
(74) *Attorney, Agent, or Firm* — Sughrue Mion, PLLC

(57) ABSTRACT

Disclosed is a method of forming a chalcogen compound thin film suitable for use in a light-absorption layer of a solar cell. The method includes manufacturing a precursor liquid including an Sn precursor material and an S precursor material, applying the precursor liquid to form a precursor film, and heat-treating the precursor film. The Sn precursor material and the S precursor material are liquid materials. The present invention provides a method of forming a chalcogen compound thin film using a liquid precursor material without a sulfurization process, thereby forming a high-quality SnS thin film at low cost using a process which is suitable for mass production. Further, the light-absorption layer is formed using a process which is suitable for mass production, thus enabling the manufacture of a solar cell including the chalcogen compound thin film at low cost.

6 Claims, 5 Drawing Sheets

METHOD OF FORMING CHALCOGEN COMPOUND LIGHT-ABSORPTION LAYER THIN FILM FOR SOLAR CELL

CROSS-REFERENCE TO RELATED APPLICATION

This application claims the priority benefit of Korean Patent Application No. 10-2015-0159160, filed on Nov. 12, 2015 in the Korean Intellectual Property Office, the disclosure of which is incorporated herein by reference.

BACKGROUND OF THE INVENTION

1. Field of the Invention

The present invention relates to a method of forming a chalcogen compound thin film, and more particularly to a method of forming a chalcogen compound thin film, which is suitable for use in a light-absorption layer of a solar cell.

2. Description of the Related Art

Recently, the importance of the development of next-generation clean energy has increased due to serious environmental pollution and the depletion of fossil fuels. A solar cell is a device that directly converts solar energy into electric energy. The solar cell induces little pollution, includes a material obtained from an infinite resource, and has a semipermanent life span, and accordingly, the solar cell is expected to be an energy source that solves future energy problems.

The solar cell is classified into various types, depending on the material that is used in a light-absorption layer. Currently, the most frequently used solar cell is a silicon solar cell using silicon. However, there is growing interest in a thin-film solar cell due to currently rapidly increasing cost of silicon attributable to the short supply thereof. Since the thin-film solar cell is manufactured to be slim, a small amount of material is used, and the application range thereof is extensive due to its low weight. Examples of a material used in practice, among the materials of the thin-film solar cell, include CdTe. Recently, CIGS (copper indium gallium selenide), having a high light-absorption coefficient, has come into the spotlight.

Among the materials that are used, CdTe and CIGS have drawbacks in that In, Ga, and Te are costly materials and Se and Cd are toxic.

In order to overcome the drawbacks, there is continued interest in novel materials for a light-absorption layer. Among the materials, SnS has a band gap (1.1 eV) which is similar to that of silicon. However, since its light-absorption coefficient is much larger than that of silicon, SnS may absorb most of the sunlight spectrum in a range that is larger than the band gap, even when SnS is formed to a thin film having a thickness of 1 μm or less. Tin and sulfur are general elements, reserves thereof are abundant, and Tin and sulfur are not toxic.

The efficiency of an SnS thin film-based solar cell has remarkably improved from 1.3% to 4.36% in the last two to three years. Efficiency is relatively low when using a thermal evaporation process but is best when using an ALD process. However, there is a drawback in that the ALD process is difficult to apply industrially. The SnS solar cell has not yet been commercialized due to the costly process of forming the SnS thin film.

SUMMARY OF THE INVENTION

Accordingly, the present invention has been made keeping in mind the above problems occurring in the related art, and an object of the present invention is to provide a method of forming a high-quality chalcogen compound thin film at low cost.

In order to accomplish the above object, the present invention provides a method of forming a chalcogen compound light-absorption layer thin film for a solar cell. The method includes manufacturing a precursor liquid including an Sn precursor material and an S precursor material, applying the precursor liquid to form a precursor film, and heat-treating the precursor film. The Sn precursor material and the S precursor material are liquid materials.

Many studies have been made into the mass production of the chalcogen compound thin film as the light-absorption layer of the solar cell at low cost using a non-vacuum process. Most of the studies adopt a sulfurization process or a selenization process. However, in the case of an SnS thin film, which is a kind of chalcogen compound thin film, a secondary phase, such as $Sn_2S_3$ or $SnS_2$, is easily generated. Accordingly, it is known that the SnS thin film having no secondary phase is not capable of being manufactured using a conventional non-vacuum process.

Therefore, in the present invention, a material in a liquid phase is used as the Sn precursor material instead of a solution obtained by dissolving different phases. The Sn precursor material is mixed with the liquid S precursor material to manufacture the precursor liquid, and the precursor liquid is used to make it possible to apply a typical heat-treating process instead of sulfurization. Accordingly, an SnS thin film that does not include the secondary phase may be formed.

Particularly, in the present invention, since the liquid precursor material is used, a drying process is not required after the precursor liquid is applied. Further, oxidation of raw materials, which may be caused by contact of the precursor liquid with oxygen during a typical drying process, may be prevented. Since the drying process does not need to be performed in the present invention, the entire process may be shortened, and oxidation of the precursor material, which is caused during the drying process, may be prevented.

Since both the Sn precursor material and the S precursor material are in a liquid phase, it is easy to control the molar ratio of Sn and S included in the precursor liquid. It is preferable that the Sn/S ratio of Sn and S be controlled to within the range of 0.8 to 1.5. When the ratio deviates from the aforementioned range, the amount of residual elements that do not constitute SnS is increased, thus reducing the quality of the SnS thin film.

In addition, it is preferable that heat treatment be performed at a temperature in the range of 450 to 520° C. When the temperature is lower than this range, it takes a very long time to form the SnS thin film, and when the temperature is higher than this range, the quality of the SnS thin film is reduced.

The liquid Sn precursor material may be a tin-organic complex in a liquid phase, which is a liquid compound including tin and an organic material, and representative examples thereof include Sn-ethyl hexanoate.

Further, the liquid S precursor material may be a material such as DMSO (dimethyl sulfoxide).

In addition, the heat treatment may be performed in an inert gas atmosphere. Since the liquid S precursor material is included in the precursor liquid, the heat treatment is preferably performed in the inert gas atmosphere.

Another aspect of the present invention provides a method of manufacturing a solar cell. The solar cell includes a chalcogen compound thin film as a light-absorption layer.

The light-absorption layer is formed using any one of the aforementioned processes of forming the thin film.

According to the method of manufacturing the solar cell of the present invention, an SnS thin film, which does not include a secondary phase, may be formed at low processing cost to thus manufacture the solar cell at low cost. Therefore, the solar cell manufactured in the present invention does not include a toxic material, and the cost per unit power is significantly reduced when electricity is generated using the solar cell, thereby significantly improving cost effectiveness.

The thin film may be formed on a soda lime glass substrate, and a molybdenum lower electrode layer may be formed on the surface of the soda lime glass substrate. The solar cell, which includes the chalcogen compound thin film as the light-absorption layer, has excellent generation efficiency when the solar cell includes the soda lime glass substrate and the molybdenum lower electrode layer.

In order to accomplish the above object, the present invention also provides a chalcogen compound thin film for use in a light-absorption layer of a solar cell. In the chalcogen compound thin film, a precursor liquid, which includes a liquid Sn precursor material and a liquid S precursor material, is applied and then heat-treated to prevent $Sn_2S_3$ and $SnS_2$ from forming. Moreover, since the chalcogen compound thin film of the present invention includes the liquid precursor material, no drying process is required. Therefore, there is no reaction of the precursor material with oxygen during the drying process, and accordingly, oxides are not present in the thin film.

In order to accomplish the above object, the present invention also provides a solar cell that includes a chalcogen compound thin film as a light-absorption layer. A precursor liquid, which includes a liquid Sn precursor material and a liquid S precursor material, is applied and then heat-treated to prevent $Sn_2S_3$ and $SnS_2$ from forming in the chalcogen compound thin film.

As described above, the present invention provides a method of forming a chalcogen compound thin film using a liquid precursor material without a sulfurization process, thereby forming a high-quality SnS thin film at low costs using a process which is suitable for mass production.

Further, since the liquid precursor material is used, a separate drying process is not required during a coating process, thereby shortening the entire process and preventing oxidation of the precursor material during the drying process.

Moreover, a light-absorption layer is formed using a process that is suitable for mass production, to thus enable the manufacture of a solar cell including the chalcogen compound thin film at low cost.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
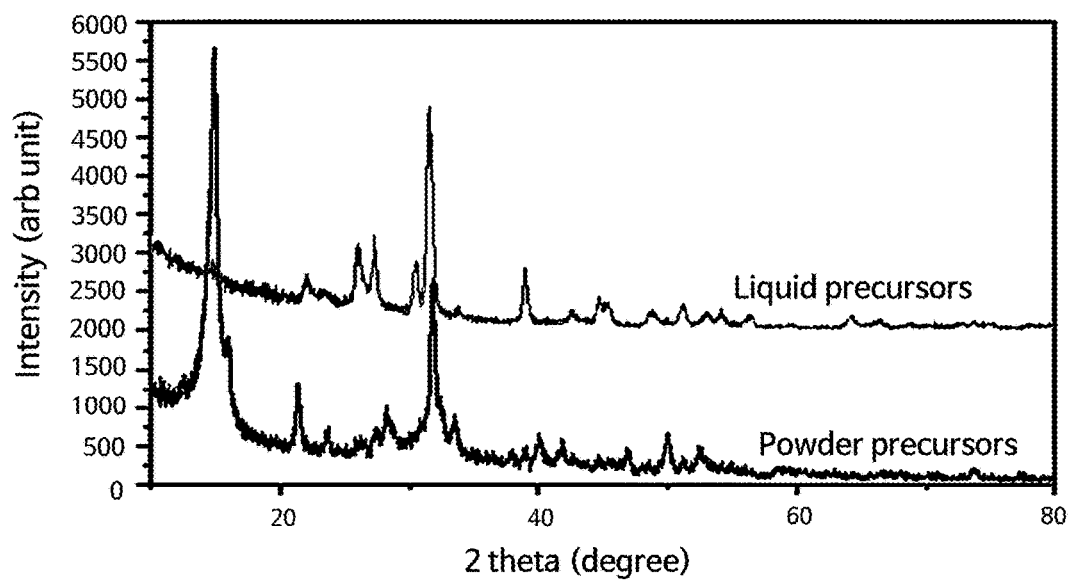
FIG. 1 shows the result of XRD analysis of an SnS thin film manufactured in an Example of the present invention and a thin film manufactured in a Comparative Example.

A detailed description will be given of an Example of the present invention with reference to the appended drawings.

A method of forming an SnS thin film according to the Example of the present invention includes manufacturing a precursor liquid, which includes a precursor material, applying the precursor liquid to form a film, and performing heat treatment.

In order to manufacture the precursor liquid, Sn-ethyl hexanoate, which is an Sn precursor material in a liquid phase, and DMSO (dimethyl sulfoxide), which is an S precursor material in a liquid phase, are mixed.

Since both the Sn precursor material and the S precursor material used in the present Example are in a liquid phase, the Sn precursor material and the S precursor material are mixed without the use of an additional solvent, thereby manufacturing the precursor liquid. Sn-ethyl hexanoate and DMSO are mixed at a molar ratio of 1:1 to manufacture the precursor liquid.

Next, the precursor liquid is applied using spin coating at 2000 rpm for 20 sec and spread to thus form a precursor film. The precursor liquid manufactured in the present Example is obtained by mixing the precursor materials in a liquid phase and has high viscosity, and accordingly, the precursor film may be formed to a sufficient thickness using only a single spin coating process for 20 sec without a separate drying process.

Finally, the precursor film, which is formed using spin coating, is heat-treated to synthesize SnS. The heat treatment process of the present Example is performed in a nitrogen gas atmosphere at a temperature of 500° C. for 30 min. Since the precursor liquid of the present Example includes both the Sn precursor material and the S precursor material, no additional material is required to synthesize SnS, and the SnS thin film may be formed using only heat treatment in the nitrogen atmosphere. First, a vacuum of $10^{-4}$ to $10^{-5}$ torr is created in a chamber, the chamber is filled with nitrogen gas until pressure reaches 1.02 atm, and the temperature is increased to 500° C. and maintained for 30 min.

A conventional process was used to form the SnS thin film as the Comparative Example to confirm the effect of the Example of the present invention. The method of forming the SnS thin film according to the Comparative Example is similar to that of the present invention in that the precursor liquid is manufactured, applied using spin coating, and heat-treated, but is different from that of the present invention in terms of the specific content of each step.

First, Sn acetate ($Sn(Ac)_2$), which is the Sn precursor in a powder phase, is dissolved in pyridine, which is a solvent, according to a typical process to manufacture a precursor solution. Sn acetate and pyridine are mixed at a weight ratio of 1:10.

Next, the manufactured precursor solution is spread using spin coating to form a precursor film. Unlike the precursor liquid of the present Example, the precursor solution of the Comparative Example is obtained by dissolving the Sn precursor in a solid phase in the solvent and has low viscosity. Accordingly, spin coating at 2000 rpm for 20 sec and drying at a temperature of 200° C. for 4 min are repeated five times to form the precursor film. Since the drying process is included, the processing time is increased, thus lengthening the entire process compared to the above Example. Further, a typical drying process is simply performed in the atmosphere. There is a drawback in that oxygen in the atmosphere may react with the precursor during the drying process.

Finally, the precursor film is sulfurized. Since only the Sn precursor is included in the precursor solution of the Comparative Example, S is supplied during the heat treatment process to perform sulfurization, during which Sn included in the precursor film is reacted with S. First, a vacuum of $10^{-4}$ to $10^{-5}$ torr is created in the chamber, the chamber is filled with a nitrogen gas until pressure reaches 1.02 atm, and the temperature is increased to 650° C. while $H_2S$ gas flows, thereby performing sulfurization for 30 min. Heat treatment is performed at a temperature higher than the heat treatment temperature of the Example due to sulfurization. The $H_2S$ and nitrogen gases are supplied in amounts of 100 sccm and 30 scan, respectively, during the heat treatment process.

Hereinafter, the characteristics of the thin films, manufactured in the Example according to the present invention and the Comparative Example, will be described.

FIG. 1 shows the result of XRD analysis of the SnS thin film manufactured in the Example of the present invention and the thin film manufactured in the Comparative Example.

As shown in the drawing, no peak of a secondary phase, other than SnS, is visible for the SnS thin film formed in the present Example, but strong peaks of $Sn_2S_3$ and $SnS_2$ are exhibited, in addition to the peak of SnS, for the thin film manufactured in the Comparative Example.

The process of forming the precursor film using the solution, which includes the precursor material in a powder phase, and then performing sulfurization (or selenization) to form the chalcogen compound thin film as in the Comparative Example, is a typical process which is used to manufacture the thin film such as CIS or CIGS. The quality of the thin film formed using the aforementioned process is inferior to that of a vacuum process, which is a costly process. However, a non-vacuum type forming process is used due to the high economic profitability of the non-vacuum process based on the low processing cost. However, as seen in the result of the Comparative Example, an excessive amount of the secondary phase is generated together with SnS, in addition to the problem of the low quality when the SnS thin film is formed. Accordingly, it is known that the non-vacuum process is not used to form an SnS thin film.

The present invention relates to a novel non-vacuum process for forming an SnS thin film that does not include the secondary phase and is shown in FIG. 1, using the precursor liquid including the liquid Sn precursor material and the liquid S precursor material mixed therein, so as to overcome the problem of the precursor solution having powder dissolved therein and the drawback of the sulfurization process.

Figure 2:
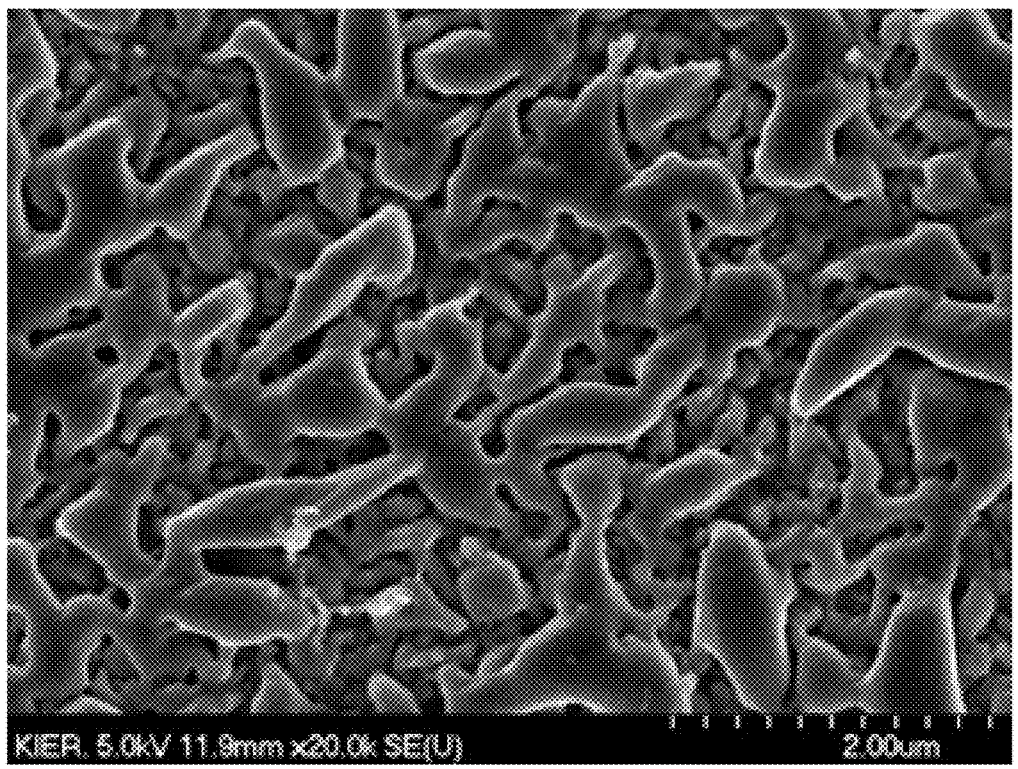
FIG. 2 is an electron microscopic picture showing the surface of the SnS thin film manufactured in the Example of the present invention.
Figure 3:
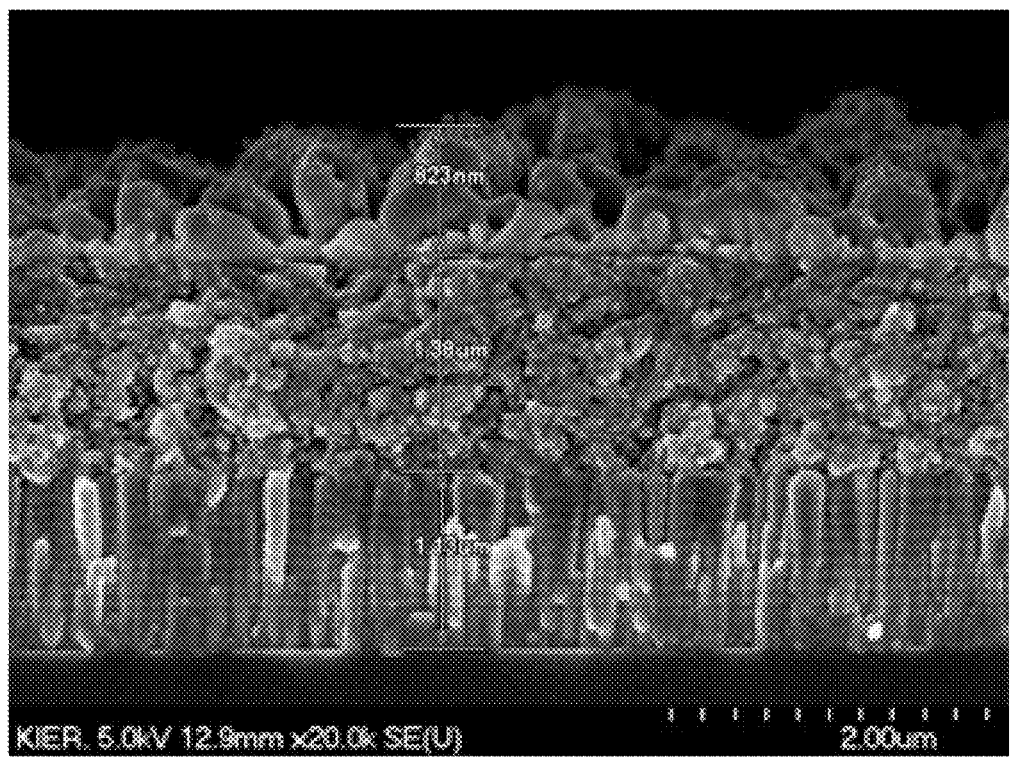
FIG. 3 is an electron microscopic picture showing the section of the SnS thin film manufactured in the Example of the present invention.
Figure 4:
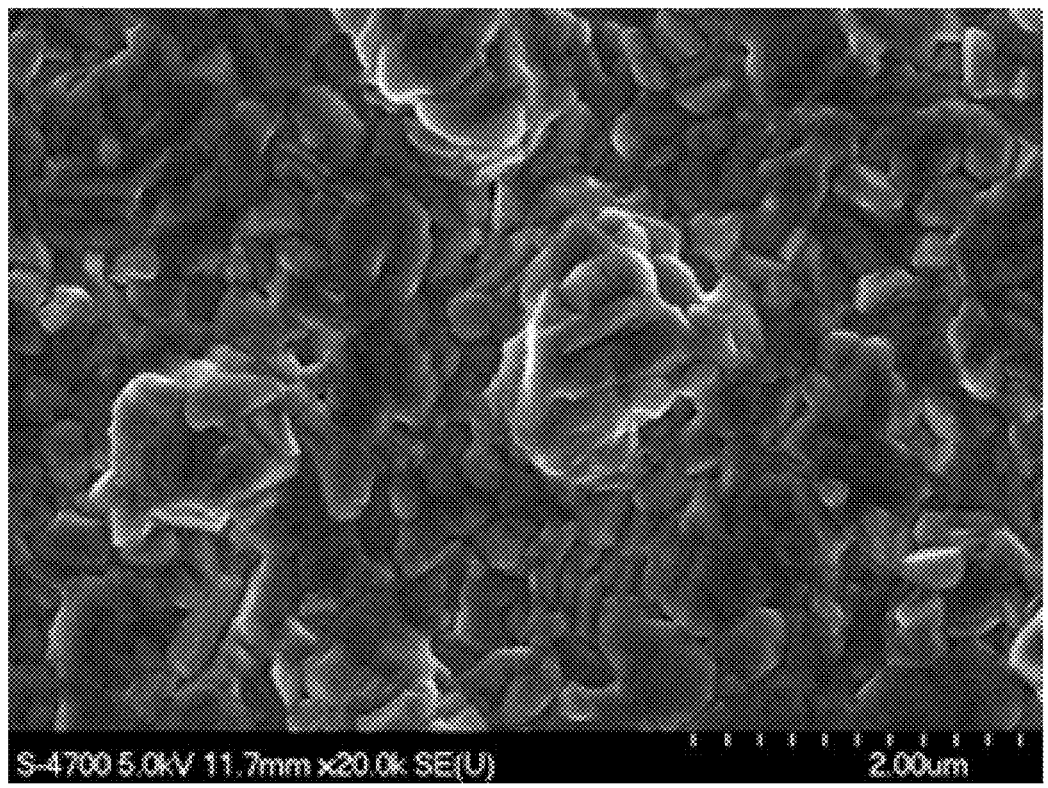
FIG. 4 is an electron microscopic picture showing the surface of the SnS thin film manufactured in the Comparative Example.
Figure 5:
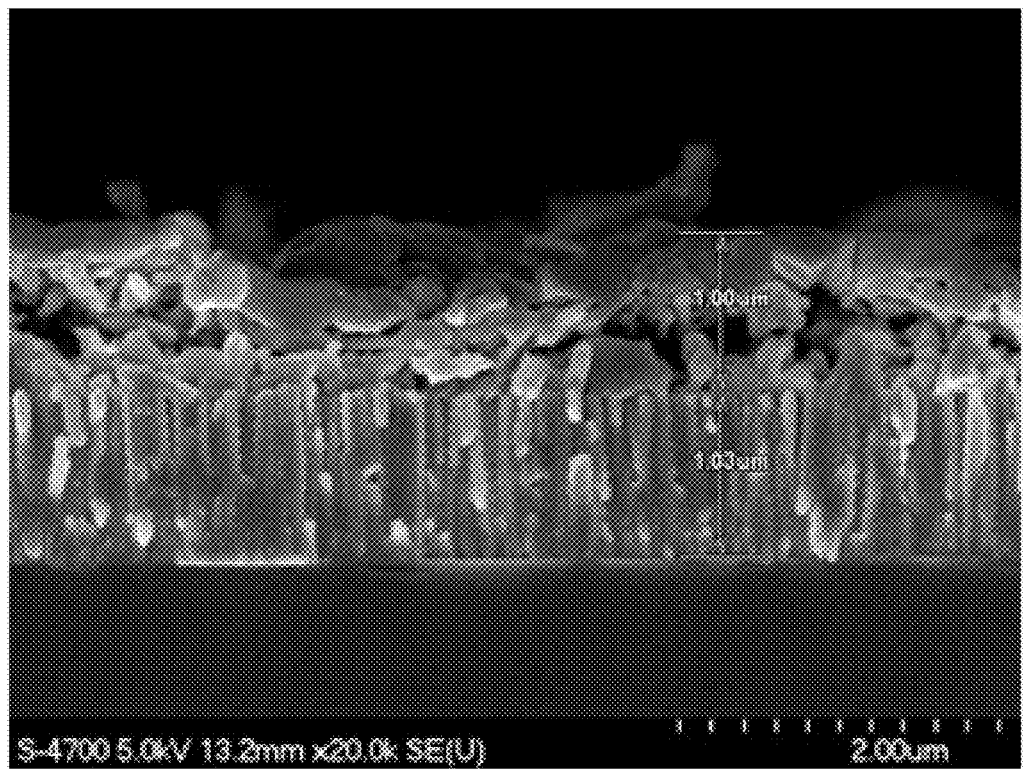
FIG. 5 is an electron microscopic picture showing the section of the SnS thin film manufactured in the Comparative Example.

FIGS. 2 and 3 are electron microscopic pictures showing the surface and the section of the SnS thin film manufactured in the Example of the present invention, and FIGS. 4 and 5 are electron microscopic pictures showing the surface and the section of the SnS thin film manufactured in the Comparative Example.

As shown in the drawings, the thin films formed in the present Example and the Comparative Example are different from each other in terms of the fine structures of the surfaces and the sections thereof. The difference depends on whether or not sulfurization is performed and on whether or not the secondary phase is formed in the thin film.

It can be confirmed that the surface and the section of the thin film formed in the present Example are regular. The thin film formed in the Comparative Example includes the secondary phase, thus exhibiting an irregular fine structure.

From the aforementioned description, it can be confirmed that a high-quality SnS thin film that does not include a secondary phase is formed using the non-vacuum process according to the present invention, which is a very inexpensive process. The SnS thin film may be applied to the light-absorption layer of a solar cell, and the process of forming the thin film according to the present invention may be applied as a process for forming the light-absorption layer to manufacture the solar cell.

A solar cell according to another aspect of the present invention may be obtained by applying the constitution of a solar cell of a typical chalcogen compound thin film without any modification, except that the light-absorption layer is included and the process of forming the SnS thin film is applied as the process of manufacturing the light-absorption layer. The specific constitution of the solar cell may include a soda lime glass substrate and a molybdenum lower electrode, which are known to improve the performance of the chalcogen compound light-absorption layer, and other specific descriptions will be omitted.

The manufacturing cost of the solar cell manufactured using the aforementioned process may be significantly reduced due to the low cost of the process of forming the light-absorption layer.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of forming an SnS thin film, the method comprising:
    manufacturing a precursor liquid including an Sn precursor material and an S precursor material;
    applying the precursor liquid to form a precursor film; and
    heat-treating the precursor film without drying to form the SnS thin film,
    wherein the Sn precursor material and the S precursor material are liquid materials, respectively, and
    wherein the Sn precursor material is a liquid tin-organic complex.

2. The method of claim 1, wherein the precursor liquid includes Sn and S such that an Sn/S molar ratio is in a range of 0.8 to 1.5.

3. The method of claim 1, wherein the tin-organic complex is Sn-ethyl hexanoate.

4. The method of claim 1, wherein the heat-treating is performed in an inert gas atmosphere.

5. A method of forming an SnS thin film, the method comprising:
    manufacturing a precursor liquid including an Sn precursor material and an S precursor material;
    applying the precursor liquid to form a precursor film; and
    heat-treating the precursor film without drying to form the SnS thin film,
    wherein the Sn precursor material and the S precursor material are liquid materials, and
    wherein the heat-treating is performed at a temperature in a range of 450 to 520° C.

6. A method of forming an SnS thin film, the method comprising:
    manufacturing a precursor liquid including an Sn precursor material and an S precursor material;
    applying the precursor liquid to form a precursor film; and
    heat-treating the precursor film without drying to form the SnS thin film,
    wherein the Sn precursor material and the S precursor material are liquid materials, and
    wherein the S precursor material is DMSO (dimethyl sulfoxide).

* * * * *